(12) United States Patent
Forbes

(10) Patent No.: US 10,648,856 B2
(45) Date of Patent: May 12, 2020

(54) METHOD AND SYSTEM FOR MEASURING BEAM QUALITY OF A LASER BEAM

(71) Applicant: UNIVERSITY OF THE WITWATERSRAND, JOHANNESBURG, Johannesburg (ZA)

(72) Inventor: Andrew Forbes, Johannesburg (ZA)

(73) Assignee: UNIVERSITY OF THE WITWATERSRAND, JOHANNESBURG, Johannesburg (ZA)

(*) Notice: Subject to any disclaimer, the term of this patent is extended or adjusted under 35 U.S.C. 154(b) by 0 days.

(21) Appl. No.: 16/310,580

(22) PCT Filed: Jun. 19, 2017

(86) PCT No.: PCT/IB2017/053624
§ 371 (c)(1),
(2) Date: Dec. 17, 2018

(87) PCT Pub. No.: WO2017/216778
PCT Pub. Date: Dec. 21, 2017

(65) Prior Publication Data
US 2019/0145821 A1    May 16, 2019

(30) Foreign Application Priority Data
Jun. 17, 2016  (ZA) .................. 2016/04282

(51) Int. Cl.
| G01J 4/00 | (2006.01) |
| G01J 1/42 | (2006.01) |
| G01J 1/04 | (2006.01) |
| G02B 5/04 | (2006.01) |
| G02B 5/30 | (2006.01) |
| G02B 27/28 | (2006.01) |
| H01L 27/146 | (2006.01) |

(52) U.S. Cl.
CPC .......... *G01J 1/4257* (2013.01); *G01J 1/0411* (2013.01); *G01J 1/0437* (2013.01); *G02B 5/04* (2013.01); *G02B 5/3083* (2013.01); *G02B 27/283* (2013.01); *H01L 27/14643* (2013.01)

(58) Field of Classification Search
CPC ...... G01N 21/21; G01N 21/211; G01N 21/23; G01J 4/04; G01J 4/00
USPC ....................................... 356/364
See application file for complete search history.

(56) References Cited

U.S. PATENT DOCUMENTS

| 5,880,838 A * | 3/1999 | Marx ............... G01B 11/02 250/237 G |
| 2013/0173194 A1* | 7/2013 | Dholakia ............ G02B 27/58 702/71 |
| 2016/0127073 A1* | 5/2016 | Ashrafi ............ H04B 10/516 398/44 |

\* cited by examiner

Primary Examiner — Md M Rahman
(74) Attorney, Agent, or Firm — Myers Bigel, P.A.

(57) ABSTRACT

This invention relates to a method of and a system for determining a beam quality factor (VQF) of a beam of light having a transverse electric field that may be scalar, vector, or a combination thereof, wherein the VQF is a measure of the degree of vectorness of the beam of light varying between pure scalar and pure vector. The beam is typically a laser beam, wherein the method comprises receiving an input laser beam to be analysed and splitting the received beam of light into two orthogonal components. A predetermined number of modes or states per orthogonal component is then detected and an on axis intensity of each detected mode or state detected is measured. The measured intensities is then used to calculate the VQF in terms using at least one quantum mechanical entanglement measure.

20 Claims, 4 Drawing Sheets

METHOD AND SYSTEM FOR MEASURING BEAM QUALITY OF A LASER BEAM

RELATED APPLICATIONS

This application is a 35 U.S.C. § 371 national stage application of PCT Application No. PCT/IB2017/053624, filed on Jun. 19, 2017, which claims priority from South African Application No. 2016/04282 filed on Jun. 17, 2016, the contents of which are incorporated herein by reference in their entireties. The above-referenced PCT International Application was published in the English language as International Publication No. WO 2017/216778 A1 on Dec. 21, 2017.

FIELD OF THE INVENTION

The invention relates to laser vector beams and quantitative quality measures for such beams

BACKGROUND TO THE INVENTION

Since the invention of the laser and the definition of its transverse modes, many studies have considered the question of a beam quality factor for arbitrary laser modes. In the early 1990s tools traditionally associated with statistics were applied to laser beams with uniform single mode and separable polarisation (scalar beams), exploiting the analogous behaviour between probability density functions and laser beam intensity profiles. Viewing the latter as a probability of finding the light, statistical moments were used to define beam and divergence widths as second moments of the intensity, ultimately giving rise to a beam quality factor, $M^2$, as a single measure of any scalar mode. This measure has since been extensively studied, with corresponding digital measurement techniques, and is incorporated into the ISO standards for measuring and defining laser beams.

In recent years, laser beams with non-uniform polarisation distributions having non-separable, multi-directional polarisation, so called vector beams, have become topical due to the scope of their applications in topics as diverse as optical microscopy, optical tweezers, quantum memories, and data encryption to mention but a few. Over the past few years, a variety of means to generate vector vortex beams have being envisioned, internal and external to laser cavities in either interferometric, or direct ways.

Despite the many advances in generating them, the means to detect or analyse them lags behind. Such detection techniques include the use of rotating analysers together with interferometers, as well as geometric phase plates with single-mode fibres. Importantly, no quantitative measure exists to define the quality of a vector mode: i.e., to differentiate them from scalar modes. Presently this is done by qualitative means, e.g., measuring the profile change after a polariser, or by averaging the degree of polarisation across the beam.

What is required are standards which can be used for such vector beams, and the present invention proposes such a measure which could be developed into an international standard. It is therefore an object of this present invention to address the aforementioned requirement and provide a quantitative beam quality measure for vector beams.

SUMMARY OF THE INVENTION

According to a first aspect of the invention, there is provided a method for determining a beam quality factor (VQF) of a beam of light having a transverse electric field that may be scalar, vector, or a combination thereof, wherein the VQF is a measure of the degree of vectorness of the beam of light varying between pure scalar and pure vector, wherein the method comprises:
  receiving a beam of light;
  splitting the received beam of light into two orthogonal components;
  detecting a predetermined number of modes or states per orthogonal component, wherein the predetermined number of modes or states detected are the same or substantially similar for each orthogonal component;
  measuring an on axis intensity of each mode or state detected; and
  calculating the VQF in terms of the measured on axis intensities using at least one quantum mechanical entanglement measure.

The beam of light is typically a laser beam, and wherein the measured on axis intensities may be normalised on axis intensities.

The step of splitting the received beam of light into two orthogonal components may comprise splitting the received beam of light into two orthogonal polarisation components, or two orthogonal spatial mode components. Thus, it follows that the step of splitting the received beam into two orthogonal polarisation components may be by way of a polarisation splitter selected from a group comprising a polarisation grating, polarisation beam splitter, geometric phase element/s, and birefringent prism/s. Moreover, the two orthogonal polarisation components may be horizontally and vertically polarised components, left-handed and right-handed circular polarised components, or diagonally and anti-diagonally polarised components.

The predetermined number of modes or states detected per orthogonal component may comprise or may be a set of six modes or states, wherein the six modes or states include a pair of orthogonal modes or states, and four associated mutually un-biased modes or states. The four associated mutually unbiased modes or states may be superpositions of the orthogonal basis modes or states with a relative phase delay between them.

The step of detecting the predetermined number of modes or states per orthogonal component may be by way of modal decomposition.

The step of detecting the predetermined number of modes or states per orthogonal component may be by way of a match filter arrangement comprising match filters in the form of holograms encoded with suitable orthogonal and mutually associated unbiased functions for detecting the orthogonal and mutually unbiased modes or states. The match filter arrangement may comprise an optical element having two zones which are each encoded or programmed with a superposition of holograms suitable for detecting the two orthogonal, and four associated mutually unbiased, modes or states, wherein the method comprises directing the two orthogonal components to the two zones, respectively, and detecting the two orthogonal, and four mutually unbiased, modes or states, per orthogonal component, in a simultaneous fashion, in real time. It will be appreciated that the optical element may be selected from a group comprising a spatial light modulator encoded with suitable digital holograms, diffractive optical elements, metamaterials, refractive structures, aspheric optical elements, and digital micro mirror devices.

The method may comprise measuring on-axis intensity of the detected modes or states in the Fourier plane via a suitable detector. The method may further comprise projecting the detected modes or states per orthogonal component onto the detector via a Fourier lens, in a spatially resolved manner, wherein the detector is a photodetector.

The at least one quantum mechanical entanglement measure may be selected from a group comprising concurrence measured with a state tomography of a laser beam, alternatively entanglement entropy, and quantum discord.

It will be appreciated that the step of calculating the VQF may comprise:

calculating three expectation values of Pauli's operators $\sigma_1$, $\sigma_2$, $\sigma_3$, wherein the first expectation value, $\sigma_1$, is calculated as the difference between the sum of the measured on axis intensities corresponding to first mutually un-biased modes or states associated with both orthogonal components and the sum of the measured on axis intensities corresponding to second mutually un-biased modes or states associated with both orthogonal components, wherein the second expectation value, $\sigma_2$, is calculated as the difference between the sum of the measured on axis intensities corresponding to third mutually un-biased modes or states associated with both orthogonal components and the sum of the measured on axis intensities corresponding to fourth mutually un-biased modes or states associated with both orthogonal components, and wherein the third expectation value, $\sigma_3$, is calculated as the difference between the sum of the measured on axis intensities corresponding to first orthogonal modes or states associated with both orthogonal components and the sum of the measured on axis intensities corresponding to second orthogonal modes or states associated with both orthogonal components;

calculating a length of the Bloch vector, s, using the calculated expectation values $\sigma_1$, $\sigma_2$, $\sigma_3$, as an input to following equation:

$$s = \left( \sum_{i=1}^{3} \langle \sigma_i \rangle^2 \right)^{\frac{1}{2}};$$

and calculating the VQF using the calculated value of the length of the Bloch vector, s, using the following equation:

$$VQF = Re(C) = Re\sqrt{(1-s^2)}$$

wherein the calculated VQF is 0 for pure scalar and 1 for pure vector, and intermediate for varying degrees of vector quality.

The step of receiving the light beam may comprise receiving a portion of a main beam of light, wherein calculating the VQF of the portion of the main beam of light is indicative of the VQF of the main beam of light.

It will be noted that the method may comprise using the measured VQF to design a laser having an output beam having predetermined vector and/or scalar characteristics.

The method may comprise using the VQF to determine the vector and/or scalar characteristic of a laser beam.

According to another aspect of the invention, there is provided a system for determining a beam quality factor (VQF) of a beam of light having a transverse electric field that may be scalar, vector, or a combination thereof, wherein the VQF is a measure of the degree of vectorness of the beam of light varying between pure scalar and pure vector, wherein the system comprises:

a beam splitter configured to split a received beam of light into two orthogonal components travelling in two optical paths;

a match filter arrangement intersecting the two optical paths, wherein the match filter arrangement is configured to detect a predetermined number of modes or states per orthogonal component, wherein the predetermined number of modes or states detected are the same or substantially similar for each orthogonal component;

a detector configured to measure an on axis intensity of each mode or state detected by the match filter arrangement; and a processor configured to receive the on axis intensities measured by the detector, or data indicative thereof, and process the same to calculate the VQF in terms of the measured on axis intensities by using at least one quantum mechanical entanglement measure.

The beam of light may be a laser beam, and wherein the detector may be configured to measure normalised on axis intensities.

The beam splitter may be a polarisation splitter configured to split the received beam of light into two orthogonal polarisation components, or a spatial mode splitter configured to split the beam or light into two orthogonal spatial mode components. The polarisation splitter may be selected from a group comprising a polarisation grating, polarisation beam splitter, geometric phase element/s, and birefringent prism/s. The two orthogonal polarisation components may be horizontally and vertically polarised components, left-handed and right-handed circular polarised components, or diagonally and anti-diagonally polarised components.

The predetermined number of modes or states detected per orthogonal component may comprise or may be a set of six modes or states, wherein the six modes or states include a pair of orthogonal modes or states, and four associated mutually un-biased modes or states. The four associated mutually unbiased modes or states may be superpositions of the orthogonal basis modes or states with a relative phase delay between them.

The matched filter arrangement may be configured to detect the predetermined number of modes or states per orthogonal component by way of modal decomposition. The match filter arrangement may comprise match filters in the form of holograms encoded with suitable orthogonal and associated mutually unbiased functions for detecting the orthogonal and mutually unbiased modes or states. Moreover, the match filter arrangement may comprise an optical element having two zones, wherein each zone may be encoded or programmed with a superposition of holograms suitable for detecting two orthogonal, and four associated mutually unbiased, modes or states in a simultaneous fashion, in real time, in use. The optical element may be elected from a group comprising a spatial light modulator encoded with suitable digital holograms, diffractive optical elements, metamaterials, refractive structures, aspheric optical elements, and digital micro mirror devices.

The system may comprise a pair of Fourier lenses, each disposed in an optical path downstream from the match filter arrangement, wherein each Fourier lens is configured to project the detected modes or states per orthogonal component onto the detector, in a spatially resolved manner, in the Fourier plane.

The detector may be a photodetector selected from a group comprising a charge coupled device (CCD), a complementary metal oxide semiconductor (CMOS) device, and a photo-diode array. The detector may comprise a predetermined number of zones corresponding to the number of modes to be detected by the match filter arrangement, wherein each zone may be configured to receive one detected mode projected thereto and measure a normalised on axis intensity corresponding to said mode. Each zone may be uniquely associated with a particular mode to be detected.

The at least one quantum mechanical entanglement measure may be selected from a group comprising concurrence measured with a state tomography of a laser beam, alternatively entanglement entropy, and quantum discord.

The processor may be configured to process the received on axis intensities measured by the detector, or data indicative thereof, thereby to calculate the VQF by:

calculating three expectation values of Pauli's operators $\sigma_1$, $\sigma_2$, $\sigma_3$, wherein the first expectation value, $\sigma_1$, is calculated as the difference between the sum of the measured on axis intensities corresponding to first mutually un-biased modes or states associated with both orthogonal components and the sum of the measured on axis intensities corresponding to second mutually un-biased modes or states associated with both orthogonal components, wherein the second expectation value, $\sigma_2$, is calculated as the difference between the sum of the measured on axis intensities corresponding to third mutually un-biased modes or states associated with both orthogonal components and the sum of the measured on axis intensities corresponding to fourth mutually un-biased modes or states associated with both orthogonal components, and wherein the third expectation value, $\sigma_3$, is calculated as the difference between the sum of the measured on axis intensities corresponding to first orthogonal modes or states associated with both orthogonal components and the sum of the measured on axis intensities corresponding to second orthogonal modes or states associated with both orthogonal components;

calculating a length of the Bloch vector, s, using the calculated expectation values $\sigma_1$, $\sigma_2$, $\sigma_3$, as an input to following equation:

$$s = \left( \sum_{i=1}^{3} \langle \sigma_i \rangle^2 \right)^{\frac{1}{2}};$$

and calculating the VQF using the calculated value of the length of the Bloch vector, s, using the following equation:

$$VQF = Re(C) = Re\sqrt{(1-s^2)}$$

wherein the calculated VQF is 0 for pure scalar and 1 for pure vector, and intermediate for varying degrees of vector quality.

It will be understood that a majority of the system may be enclosed in a suitable optically insulated housing, wherein the housing may comprise a suitable input port configured to receive the beam of light.

The system may comprise a suitable output device for outputting the calculated VQF, wherein the output device is selected from a group comprising a visual display, and an audible output device.

According to another aspect of the invention, there is provided a vector quality factor (VQF) for the quantitative measurement of a beam having a transverse electric field that may be scalar or vector or a combination thereof, wherein the VQF is defined as a measure of the degree of vectorness of the beam as a single number, such that the VQF is 0 for pure scalar and 1 for pure vector, and intermediate for varying degrees of vector quality.

According to further aspects of the invention there is provided an apparatus and/or method relying on the calculation of the VQF as defined above thereby to quantitatively measure a laser beam.

According to a further aspect of the invention, there is provided a method of determining the VQF of a beam the method comprising:

splitting the beam into two orthogonal polarisation components, detecting and measuring a plurality of patterns per polarisation component thereby to determine each pattern's normalised on axis intensity, and calculating the VQF in terms of the normalised intensities using quantum mechanical entanglement measures.

According to a further aspect of the invention there is provided vector quality analyser to determine a vector quality factor (VQF) of a beam, the vector quality analyser comprising:

a polarisation detector configured to split the laser beam into two orthogonal polarisation components, a spatial mode detector configured to detect and measure a plurality of patterns per polarisation component thereby to determine each pattern's normalised on axis intensity, and a processor configured to calculate the VQF in terms of the normalised intensities using quantum mechanical entanglement measures.

According to yet another aspect of the invention, there are provided methods of quantitative quality measurement of vector beams substantially as described herein.

According to a further aspect of the invention, there is provided a method for manufacturing and/or designing a laser having an output laser beam having predetermined or desired vector and/or scalar characteristics, wherein the method comprises determining the VQF of the laser in a fashion described, and adapting the laser, for example, tuning the same, to have the predetermined or desired vector and/or scalar characteristics by monitoring the determined VQF.

According to yet another example embodiment of the invention, there is provided a method of tuning a laser to have an output laser beam with predetermined or desired vector and/or scalar characteristics, wherein the method comprises varying parameters, for example operating parameters of the laser, or components of the laser, to have the predetermined or desired vector and/or scalar characteristics by monitoring a VQF of the output beam determined in a manner described herein.

In other words, it will be noted that the VQF may be used as a parameter by which a laser may be tuned to, for example, an operator requiring a purely vector laser beam will be able to tune or adapt their laser until the VQF being measured by the system described herein is 1.

BRIEF DESCRIPTION OF THE FIGURES

Non-limiting embodiments of the invention will now be described by way of example only and with reference to the following Figures.

DESCRIPTION OF PREFERRED EMBODIMENTS

In the following description, for purposes of explanation, numerous specific details are set forth in order to provide a thorough understanding of an embodiment of the present disclosure. It will be evident, however, to one skilled in the art that the present disclosure may be practiced without these specific details.

Figure 1:
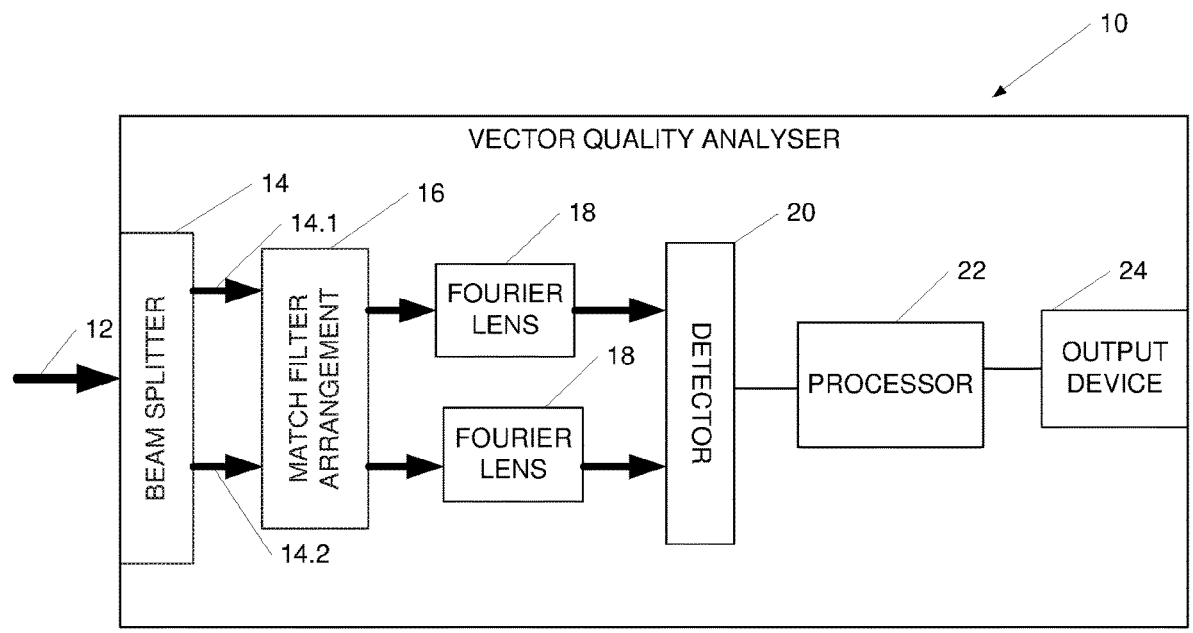
FIG. 1 shows a schematic block diagram of a system or in other words a vector quality analyser for determining a VQF of an input beam of light in accordance with an example embodiment of the invention.
Figure 2:
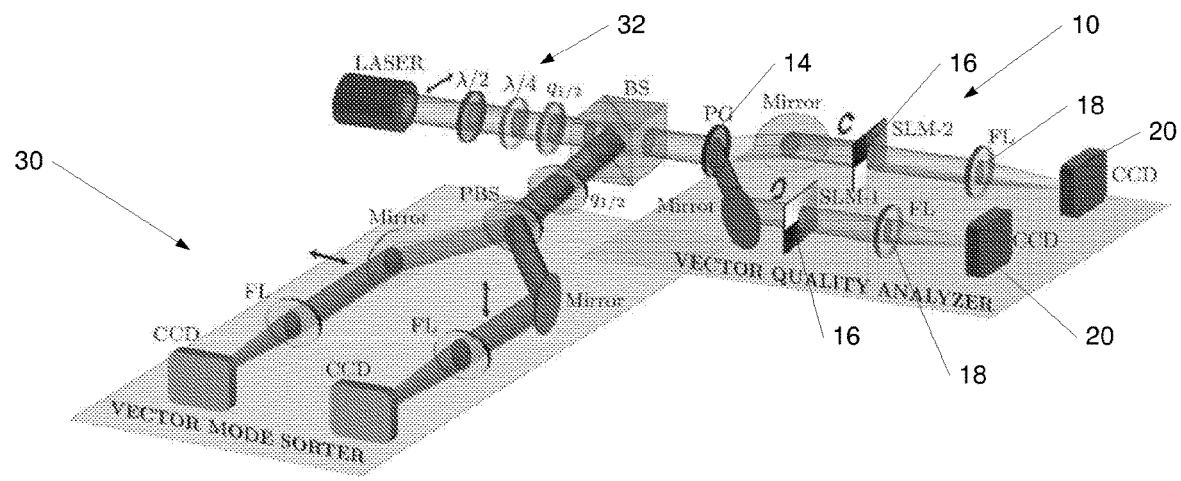
FIG. 2 shows an illustration of an experimental set-up for the generation and analysis of vector modes showing a system or vector quality analyser in accordance with an example embodiment of the present invention as well as a vector mode sorter, which in a further example embodiment of the invention is combined with the system.

Referring to FIGS. 1 and 2 of the drawings, a system, also referred to as a vector quality analyser, in accordance with an example embodiment of the invention is generally indicated by reference numeral 10. Though the analyser 10 illustrated generally in FIG. 1 is a real-world implementation of the analyser 10, and the analyser 10 illustrated in FIG. 2 is part of an experimental setup 9, it will be appreciated that both are substantially similar unless otherwise stated or is evident by those skilled in the art. Moreover, similar parts will be referred to by the same reference numerals and, as such, unless otherwise stated, the explanations for the similar parts will apply to both FIGS. 1 and 2.

The system 10 is typically employed for determining a beam quality factor of an input light beam 12 received by the system 10. The light beam 12 is typically a beam of light having transverse electric field that may be scalar, vector, or a combination thereof. In one example embodiment, the light beam 12 is a laser beam of unknown vector and/or scalar characteristics and, as such, the system 10 is configured to determine a VQF thereof so as to determine the quality of the received laser beam. In this regard, the VQF is a measure of the degree of vectorness of the laser beam which varies between pure scalar and pure vector.

Differently defined, considering a transverse electric field in any coordinate system (r) of the form:

$$U(r,\theta)=\cos\theta u_L(r)e_L+\sin\theta u_R(r)e_R \qquad (1)$$

where $e_L$ and $e_R$ represent left- and right-handed polarisation states with associated spatial modes $u_L(r)$ and $u_R(r)$, respectively. The parameter $\theta$ determines if the transverse mode, $U(r, \theta)$, is purely vector ($\theta=\pi/4$), purely scalar ($\theta=0$) or some partially vector mode. The system 10 seeks to provide a means, by way of the VQF, to map purely scalar through purely vector beams to the range 0 through 1 given the left hand side of Eq. (1), as will be described below.

Though not illustrated, the system 10 is typically enclosed in an optically insulated housing so that noise and unwanted optical signals are not introduced to the system, at least to the optical elements of the system 10.

The system 10 may be coupled to a laser beam during operation thereof, for example, a main laser beam performing a certain desired task such as cutting of materials, measurement procedures, etc. so as to provide a real-time determination of a VQF of the main laser beam which will allow operators of the laser beams to assess the quality of their laser beams with respect to the vectorness, or scalarness for that matter, of their beam. In this example embodiment, only a percentage, for example, 1%, of the main laser beam may be directed to the system 10 to determine the VQF in a manner described herein. In this way, operators need not experience downtime on their main laser beams to assess the quality thereof but are able to monitor the VQF thereof in real-time during operation of the main laser beams.

It will be noted that in other example embodiments, the system 10 may be employed in the design of lasers, for example, a laser having a particular output beam of a particular desired degree of vectorness and/or scalarness as will be understood by those skilled in the field.

The system 10 is typically configured to receive the incoming laser beam by way of an input port (not shown) provided in the housing. In one non-limiting example embodiment, for a received laser beam 12, consider a cylindrical vector vortex mode, defined in standard polar coordinates:

$$U(r,\varnothing,\theta)=\cos\theta\exp(-il\varnothing)e_L+\sin\theta\exp(-il\varnothing)e_R \qquad (2)$$

wherein l is the azimuthal index of the beam 12 carrying $l\hbar$ quanta of orbital angular momentum (OAM) per photon. For example, $\theta=\pi/4$ would define a radially polarised vector mode, while $\theta=-\pi/4$ would define an azimuthally polarised mode. For a left-(right-) circularly polarised scalar vortex mode, $\theta=0$ ($\pi/2$).

In any event, the system 10 typically comprise a beam splitter 14 configured to split the received laser beam 12 into two orthogonal components 14.1 and 14.2 travelling in two optical paths. The orthogonal components 14.1, 14.2, may be orthogonally polarised beams of light, or orthogonal spatial modes of light. However, for ease of explanation the orthogonal components 14.1, 14.2 are described with reference to orthogonally polarised components or beams of light which may be horizontally and vertically polarised components, left-handed and right-handed circular polarised components, diagonally and anti-diagonally polarised components, or the like. It follows that the beam splitter 14 may be in the form of a polarisation splitter selected from a group comprising a polarisation grating, polarisation beam splitter, geometric phase element/s, and birefringent prism/s.

The system 10 further comprises a match filter arrangement 16 disposed in the two optical paths so as to intersect with the orthogonal components 14.1, 14.2. The match filter arrangement 16 is configured to detect a predetermined number of modes or states per orthogonal component 14.1, 14.2, wherein the predetermined number of modes or states detected are the same or substantially similar for each orthogonal component 14.1, 14.2.

In a particular example embodiment, the arrangement 16 is configured to detect a set of six identical modes per orthogonal polarisation component 14.1, 14.2 (i.e., twelve modes in total for both components 14.1, 14.2), wherein the six modes include a pair of orthogonal modes, and four associated mutually un-biased modes. It will be appreciated that the detected modes may be considered as patterns detected.

The four associated mutually unbiased modes are superpositions of the orthogonal basis modes with a relative phase delay between them, as will be described below. Moreover, also as described below, it will be noted that the match filter arrangement 16 comprises match filters in the form of holograms encoded with suitable orthogonal and associated mutually unbiased functions for detecting the orthogonal and mutually unbiased modes. In particular, the match filter arrangement 16 comprises an optical element encoded or programmed with a superposition of holograms suitable for detecting two orthogonal, and four associated mutually unbiased, modes, per polarisation component in a simultaneous fashion, in real time, in use. The optical element is selected from a group comprising a spatial light modulator encoded with suitable digital holograms, diffractive optical elements, metamaterials, refractive structures, aspheric optical elements, and digital micro mirror devices so as to increase speed, efficiency or power handling capacities. In general, any approach to detecting spatial modes may be employed.

In one example embodiment of the match filter arrangement 16, all the required holograms to detect the various modes described above are multiplexed into one single hologram displayed on a spatial light modulator, or encoded in another optical element. In another example embodiment, a superposition of the six match filters or holograms used to detect the aforementioned modes, each having a transmission function $t_n(r)$ and a unique carrier frequency $K_n$, is encoded on two halves of an optical element, for example, a single spatial light modulator as will be discussed below with reference to FIG. 6. The transmission function of each half is thus given by:

$$T(r)=\Sigma_{n=1}^{6}t_n(r)\exp(iK_n r) \quad (3)$$

The system 10 further comprises a pair of Fourier lenses 18, and a detector 20 disposed optically downstream from the match filter arrangement 16 so as to measure the normalised on axis intensities of the modes detected by the arrangement 16 for both orthogonal polarisation components 14.1, 14.2 in a spatially resolved manner.

The detector 20 may be a photodetector selected according to wavelength and power levels to be detected. In a preferred example embodiment, the detector 20 is a CCD (Charge Coupled Device). It will be noted that all 12 detected modes may be projected in a spatially resolved manner to predetermined locations or zones on the detector 20. In this regard, the system 10 may have, a priori, information regarding the detected modes that will be projected onto respective zones of the detector such that the intensities received at particular zones on the detector 20 may be matched to particular detected modes associated with the system 10. For example, in one example embodiment, the detector 20 may be segmented, divided, or partitioned, into twelve zones wherein the twelve detected modes, as described above, are projected in the zones, respectively in a predetermined fashion. In this way, for example, intensities measured at zones 1 to 4 of the detector 20 may correspond to two detected orthogonal modes of both the orthogonal components.

The system 10 further comprises a processor 22 electrically coupled to detector 20. The processor 22 may typically be one or a combination of microcontrollers, processors, graphics processors, or field programmable gate arrays (FPGAs) operable to achieve the desired operation as described herein. The processor 20 may be operable under instructions stored in an internal memory or external memory device (not shown) to perform the operations of the processor 22 described herein. In particular, the processor 22 is configured to receive the normalised on axis intensities from the detector 20, particularly intensity values or data indicative thereof, and use the same as an input to quantum mechanical entanglement measurements so as to calculate a VQF.

As alluded to above, in one example embodiment, the processor 22 may store information indicative of the twelve zones of the detector 20 and the detected modes to be projected thereto. In this way, the processor 22 may be operable to receive normalised on axis intensity values from each zone of the twelve zones of the detector 20 and associate each received normalised on axis intensity value received with a particular mode detected.

The processor 22 is configured to use the received normalised on axis intensities corresponding to the detected modes to calculate the VQF. In particular, the processor 22 may be configured to calculate the VQF by determining or calculating the concurrence C (the degree of entanglement) of the received beam 12, wherein the VQF is calculated as:

$$VQF=Re(C)=Re\sqrt{(1-s^2)}=|\sin(2\theta)| \quad (4)$$

where s is the length of the Bloch vector, defined as:

$$s = \left(\sum_{i=1}^{3} \langle\sigma_i\rangle^2\right)^{\frac{1}{2}} \quad (5)$$

Here i=1, 2, 3 and $\sigma_i$ are the expectation values of the Pauli operators, which represent a set of normalised intensity measurements calculated from the twelve normalised on axis intensities measured by the detector 20 corresponding to the twelve detected modes, as will be described below.

The system 10 may further comprise an output module 24, in the form of a display, for example, an LCD (Liquid Crystal Display), Light Emitting Diode (LED) screen, CRT (Cathode Ray Tube) screen, or the like. In alternate example embodiments, the output module 24 may be in the form of an audible output, this may, for example, be used to signal to an operator if a VQF calculated falls above or below a predetermined threshold, etc.

It will be understood by those skilled in the field of invention that the processor 22 and the output module 24 need not be located within the housing of the system 10 but may be electrically connectable to an output of the detector 20 so as to receive signals indicative of the normalised on-axis intensities therefrom. In this way a modular implementation of the system 10 may be achieved wherein, the optical elements 14, 16, 18, and 20 thereof may be located in the optically insulated housing, wherein an output port is located in the housing to facilitate electrical connection between an output from the detector 20 and the processor 22.

Though not illustrated, it will be noted that the system 10 may comprise associated biasing and/or driving circuitry, and a power source, for operating the detector 20, processor 22, and output module 24. Similarly, the system 10 may comprise suitable optical elements such as mirrors, and the like for manipulating light in the system 10 in a desired fashion.

In use, referring now not only to FIGS. 1 and 2 of the drawings, but also to FIGS. 3 to 6, the system 10 is described both generally by way of example and specifically with reference to the experimental setup. It will be appreciated that further details, for example, implementation details of the system 10, may become apparent from the discussion which follows, particularly with respect to the discussion of the experimental setup 9 illustrated in FIG. 2.

In any event the analyser or system 10 is typically located in the path of a laser beam, or a portion of a main laser beam is directed to the system 10. A laser beam 12 is thus received in the housing via an input port.

With reference to Eq. (2) above, for a particular vector vortex laser beam 12 received, if circular polarisation is chosen as the measurement basis, i.e. i={L, R}, then the six projections to detected and measured per polarisation component are represented by two pure OAM modes, l, -l and four superposition states, $\exp(-il\phi)+\exp(i\alpha)\exp(-(-i/\phi))$, defined by the intermodal angle $\alpha=0, \pi/2l, \pi/l, 3\pi/2l$. In other words, two orthogonal modes and associated four mutually unbiased modes as described above.

It follows that in the example embodiment described herein, the received laser beam 12 is spilt into left and right circular polarisations by way of the beam splitter 14 and the match filter 16 detects six modes per polarisation (i.e., six detected modes for each of the basis states) thereby yielding twelve normalised on axis intensity measurements at the detector 20.

Table 1 shows an example embodiment how each of the twelve intensities I measured at the detector 20 is assigned to its respective basis state and projective measurement for a first-order vector vortex mode.

TABLE 1

Designation of normalised intensity measurements at the detector 20

| Basis state | I = 1 | I = -1- | $\alpha = 0$ | $\alpha = \pi/2$ | $\alpha = \pi$ | $\alpha = 3\pi/2$ |
|---|---|---|---|---|---|---|
| L | $I_{11}$ | $I_{12}$ | $I_{13}$ | $I_{14}$ | $I_{15}$ | $I_{16}$ |
| R | $I_{21}$ | $I_{22}$ | $I_{23}$ | $I_{24}$ | $I_{25}$ | $I_{26}$ |

These six OAM measurements map the higher-order Poincaré sphere.

Now with reference to Eq. (5) and Table 1 above, the processor 22 is configured to use the twelve normalised on axis intensity measurements received from the detector 20 (which correspond to Table 1) to calculate the aforementioned expectation values of the Pauli operators by way of the following equations:

$$\langle\sigma_1\rangle=(I_{13}+I_{23})-(I_{15}+I_{25}) \quad (6)$$

$$\langle\sigma_2\rangle=(I_{14}+I_{24})-(I_{16}+I_{26}) \quad (7)$$

$$\langle\sigma_3\rangle=(I_{11}+I_{21})-(I_{12}+I_{22}) \quad (8)$$

In calculating three expectation values of Pauli's operators $\sigma 1, \sigma 2, \sigma 3$, it will be noted that the processor 22 is configured to calculate the first expectation value, $\sigma 1$, as the difference between the sum of the measured on axis intensities corresponding to first mutually un-biased modes associated with both orthogonal components $I_{13}$ & $I_{23}$ and the sum of the measured on axis intensities corresponding to second mutually un-biased modes associated with both orthogonal components $I_{15}$ & $I_{25}$. Similarly, the processor 22 is configured to calculate the second expectation value, $\sigma 2$, as the difference between the sum of the measured on axis intensities corresponding to third mutually un-biased modes associated with both orthogonal components $I_{14}$ & $I_{24}$ and the sum of the measured on axis intensities corresponding to fourth mutually un-biased modes associated with both orthogonal components $I_{16}$ & $I_{26}$. Also similarly, the processor 22 is configured to calculate the third expectation value, $\sigma 3$, as the difference between the sum of the measured on axis intensities corresponding to first orthogonal modes associated with both orthogonal components $I_{11}$ & $I_{21}$ and the sum of the measured on axis intensities corresponding to second orthogonal modes associated with both orthogonal components $I_{12}$ & $I_{22}$.

The processor 22 then uses the abovementioned determined expectation values as an input to calculate or determine the length of the Bloch vector, s, using Eq. (5), and then uses the calculated or determined length of the Bloch vector, s, as an input to Eq. (4) thereby to yield a VQF value indicative of the degree of vectorness of the received beam 12, which value is then output by way of the module 24 in a conventional fashion, for example, displayed via an LCD display, etc.

It will be noted that the expectation values in Eqs. (6-8) resemble the Stokes parameters used in recovering the polarisation distribution, but are in fact fundamentally different: they do not represent a series of polarisation measurements but rather a series of holographic measurements of the spatial field, and result in a measure of the degree of nonseparability of vector beams. This is implemented experimentally by employing a combination of geometric and dynamic phase control.

Referring particularly to the experimental setup 9 in FIG. 2 and FIGS. 3 to 6, the setup 9, approach, and results are discussed further herein for completeness and at least to support the aforementioned discussion.

The setup 9 illustrates not only the vector quality analyser/system 10, as described above, but also a vector mode sorter 30, and means for generating a vector vortex beam 32. FIG. 2 shows the generation of a vector vortex beam using a q-plate, which follows the selection rules (written in bra-ket notation): $|l, L\rangle \rightarrow |l+Q, R\rangle$ and $|l, R\rangle |l-Q, L\rangle$. The azimuthal charge introduced by the q-plate is Q=2q=1. It will be appreciated that this method of generation of a beam is merely one example thereof and that persons skilled in the art would appreciate that various other suitable methods could be employed.

Irrespective of the generation technique, the vector mode is analysed in two different systems in the experimental setup 9: a vector quality detection system 10 as described above and herein, and a vector mode sorter 30. The latter distinguishes between different vector modes, while the former provides a quantifiable measure of the quality of the vector mode, i.e. it provides a vector quality factor (VQF) as described above.

In any event, both systems make use of a modal decomposition technique as described in A. Forbes, A. Dudley, and M. McLaren, Adv. Opt. Photonics 8, 200-227 (2016), where an inner product of the incident field with a match filter is used to determine the weighting coefficients of the modes. Here, an input field V(r) is decomposed into basis states $U_p(r)$ such that $V(r)=\Sigma_p a_p U_p(r)$. The modulus of the modal weighting coefficients $a_p$ is determined by the inner product of the incident field with a match filter: $|\langle U_p|V\rangle|=|a_p|$. Optically, the determination of the inner product is performed by directing the incident beam onto a match filter arrangement 16 and viewing the Fourier transform, with the use of a lens (FL) 18, on a CCD camera 20, wherein the match filter arrangement 16 comprises a suitable match filter substantially as described above.

Vector Mode Sorter

Turning to the mode sorter 30, using a half wave plate ($\lambda/2$) to adjust the polarisation of the fundamental Gaussian mode, cylindrical vector modes with a q-plate of topological charge q=½ are generated and directed into two detection systems, i.e. into the vector mode sorter 30 and into the vector quality analyser 10 (discussed in more detail below). The vector mode sorter 30 distinguishes vector modes in that one of the beams is passed through a second q-plate and a polarising beam splitter (PBS), the two acting as a correlation filter. The output of the correlation is measured at the Fourier lens (FL).

Figure 3:
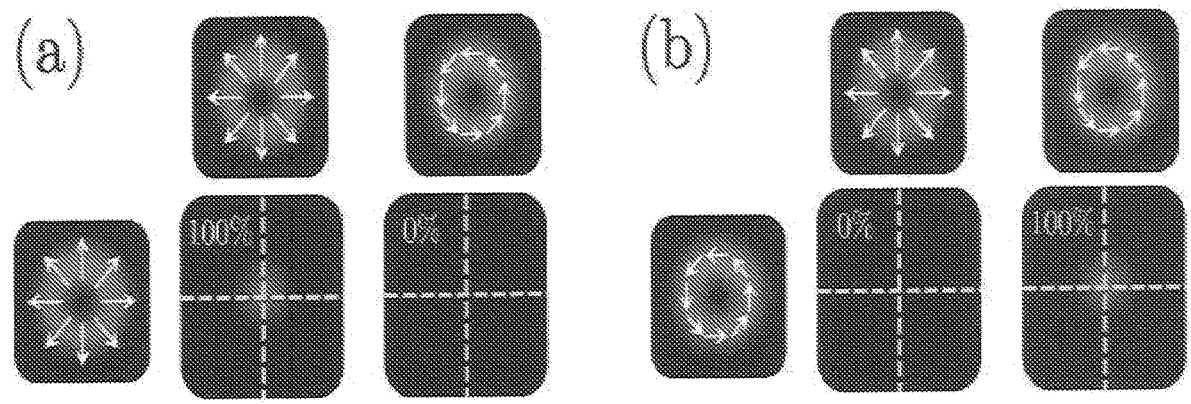
FIG. 3 shows an illustration indicating the sorting of radially and azimuthally polarised vector vortex beams by the vector mode sorter of FIG. 2.
Figure 4:
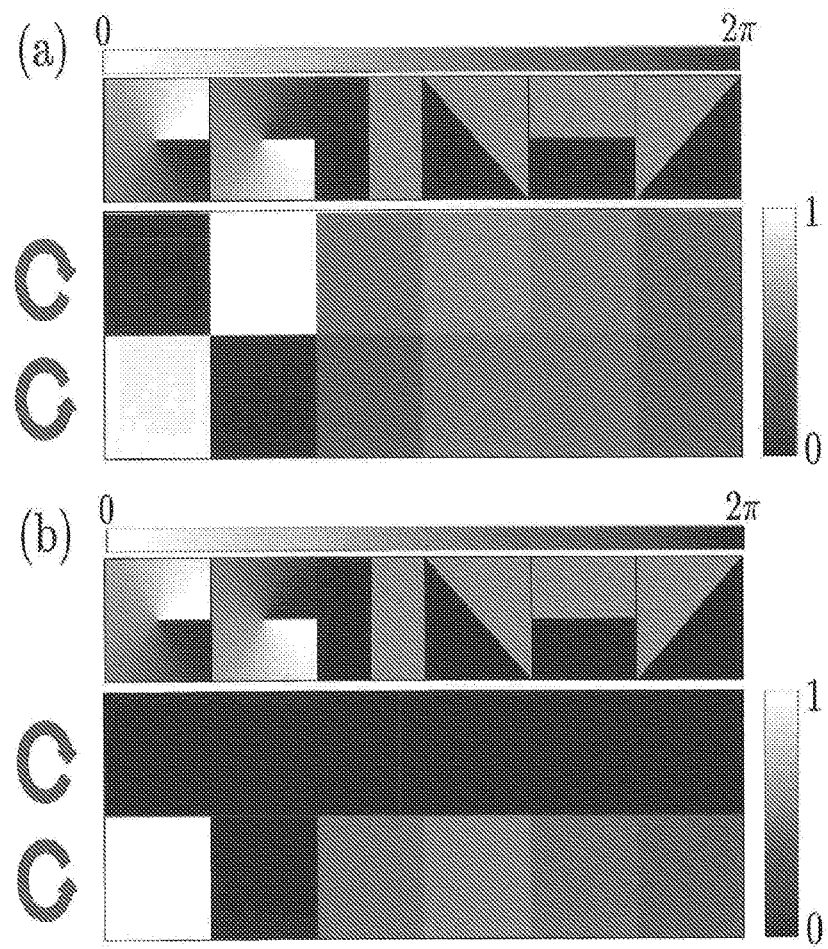
FIG. 4 shows a graphical depiction of the actual intensity measurements of the vector quality analyser of FIGS. 1 and 2, corresponding to those of Table 1 below, with holograms shown in each column and the two polarisation measurements in the rows.

In the case of the mode sorter, which distinguishes between radially and azimuthally polarised vector beams, a q-plate of charge q=½ together with a polarising beam splitter (PBS) formed the match filter for the modal decomposition. The q-plate converts a radially (azimuthally) polarised vector vortex beam into a Gaussian mode with homogeneous polarisation. A Fourier lens (FL) was placed in each polarisation component or arm and the on-axis intensity was recorded on the CCD camera. That is, if a radially (azimuthally) polarised vector vortex beam is directed into the mode sorter, a non-zero on-axis intensity will only be detected in the horizontal (vertical) polarisation arm. The experimental results are shown in FIG. 3, where a radially (FIG. 3(a)) and an azimuthally (FIG. 3(b)) polarised vector vortex beam were both detected with 100% certainty in each case. That is, by measuring the on-axis intensity, the relative weightings of the two vector modes for (a) radially and (b) azimuthally polarised beam input were determined. When the vector mode consists of a mixture of azimuthal and radial polarisation, e.g. a hybrid electric mode $HE_{21}$, due to mode coupling in a fibre, the decomposition technique allows the relative weightings to be accurately determined.

Vector Quality Analyser

Two cylindrical vector modes are generated with a q-plate of topological charge q=½, with one of these modes being directed to the vector quality analyser 10. The vector quality analyser 10, in contrast to the vector mode sorter 30, determines the vector quality factor by measurement of polarisation states, measurement (or detection) of spatial modes and then calculating the VQF from normalised intensities of the spatial modes using quantum mechanical entanglement measures as previously discussed.

Thus, by performing a series of polarisation projections using a polarisation detector in the form of a polarised grating (PG) 14 and a spatial mode detector using orbital angular momentum (OAM) projections with phase patterns encoded on the spatial light modulator (SLM) 16, the VQF is calculated in the fashion described herein. The outputs are measured in the Fourier plane of two Fourier lenses 18 combined with CCDs 20 as shown in FIG. 2.

Similarly as described above, in the experimental setup 9, the polarisation component 14.1, 14.2 was measured using the polarisation grating (PG), which uses geometric phase to diffract light into two beams in the +1 and −1 orders such that the two output beams have opposite circular polarisations. Each polarisation component or arm was directed onto a spatial light modulator (SLM) 16 encoded with a digital phase pattern that acts as the azimuthal match filter for the decomposition. SLMs are polarisation sensitive in that the desired beam reflected from the screen consists of only horizontally polarised light. As such, there is no need to place an additional quarter-wave plate before the SLMs to convert circular polarisation to linear. In order to satisfy Equations (6-8), the on-axis intensity for six different OAM states were measured in each polarisation arm (component) in a manner described above with the detector in the form of CCDs 20.

FIGS. 4(a) and 4(b) show the twelve normalised intensity measurements by the vector quality analyser of FIG. 2 for a vector vortex beam (i.e. FIG. 4(a)—a vector vortex mode) and scalar vortex beam (i.e. FIG. 4(b)—a scalar vortex mode), respectively. Holograms are shown in each column and the two polarisation measurements are shown in the rows. The scalar mode has only one polarisation component and is separable, whereas the vector mode has both and is non-separable. In this case, the circular polarisation basis was chosen and six different OAM projections were made for both the left- and right-circular polarisation states. Phase-only holograms were encoded onto the SLM 16 to detect the azimuthal component of the vortex modes.

Using Eqs. (4-8), by way of a suitable processor, for example similar to the processor 22 described above in a manner described above, the VQF was calculated to be 0.98+/−0.01 for a radially polarised vector vortex beam and 0 for a scalar vortex mode.

By simply rotating the quarter-wave plate, ($\lambda/4$), before the first q-plate in the generation section, the state of the beam created can be varied continuously from purely vector to purely scalar; this amounts to varying $\theta$ in Eq. (2). As such, the VQF was measured for different orientations of the quarter-wave plate and the results, graphically illustrated in FIG. 5, show that this measurement of the vector quality maps purely scalar through to purely vector beams with the range 0 through 1.

Figure 5:
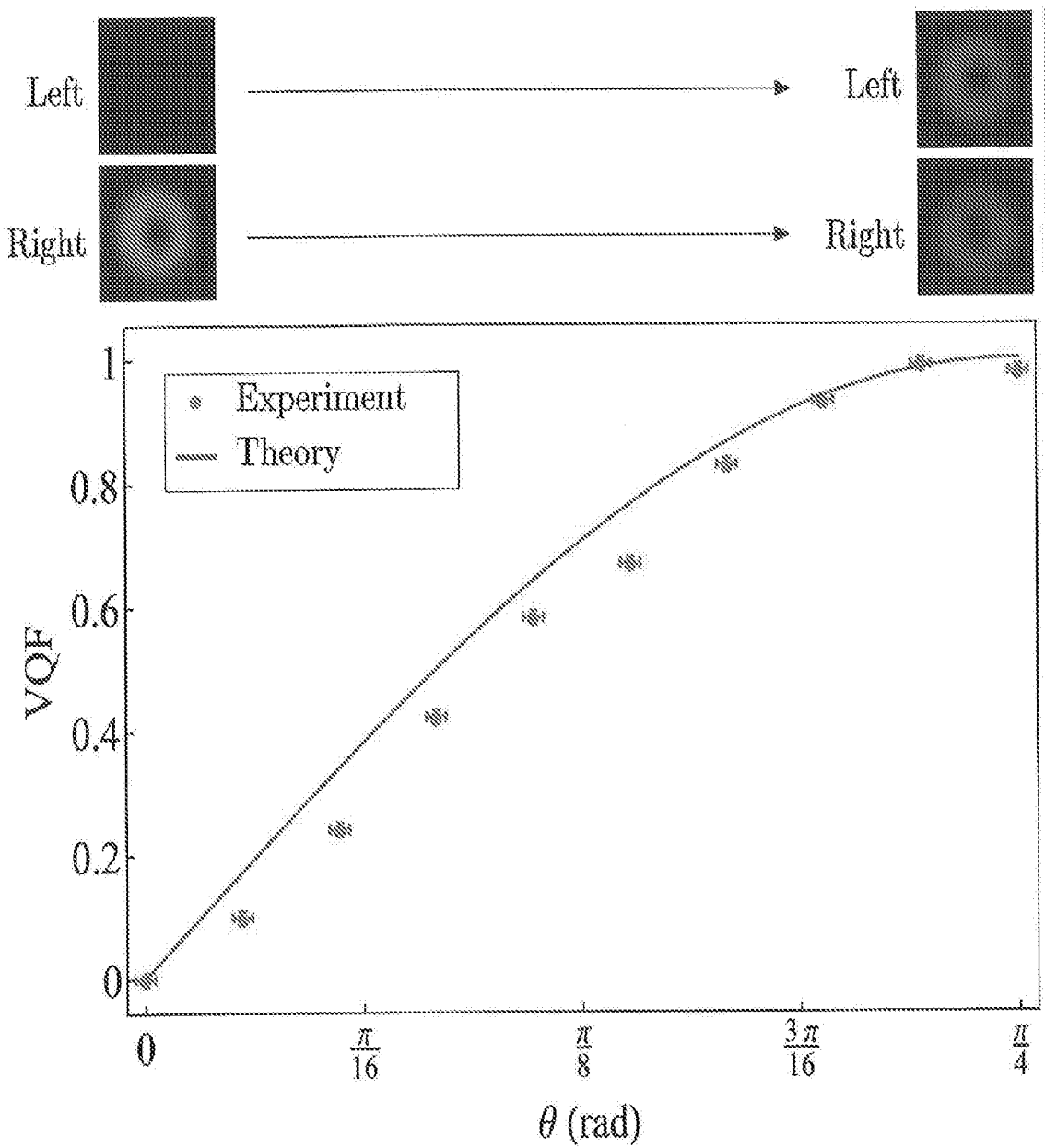
FIG. 5 shows an illustration of the evolution of the vector quality factor (VQF), as calculated by the vector quality analyser of FIGS. 1 and 2, graphically and illustratively, with respect to the nature of the input state.

In particular, FIG. 5 shows the evolution of the vector quality factor (VQF), as calculated by the vector quality analyser 10 of FIG. 2, with respect to the nature of the input state. As mentioned, using the quarter-wave plate ($\lambda/4$) before the first q-plate in the generation section, the polarisation of the input Gaussian beam was varied from linear to circular, such that the vortex beam generated after the q-plate varied from vector to scalar, respectively. The VQF was calculated from the 12 decomposition measurements (dots) and plotted against the theoretical predictions (solid line) for each orientation of the quarter-wave plate. The experimental images show the relative intensities of the left- and right-circular polarisation states for different orientations of the quarter-wave plate.

Figure 6:
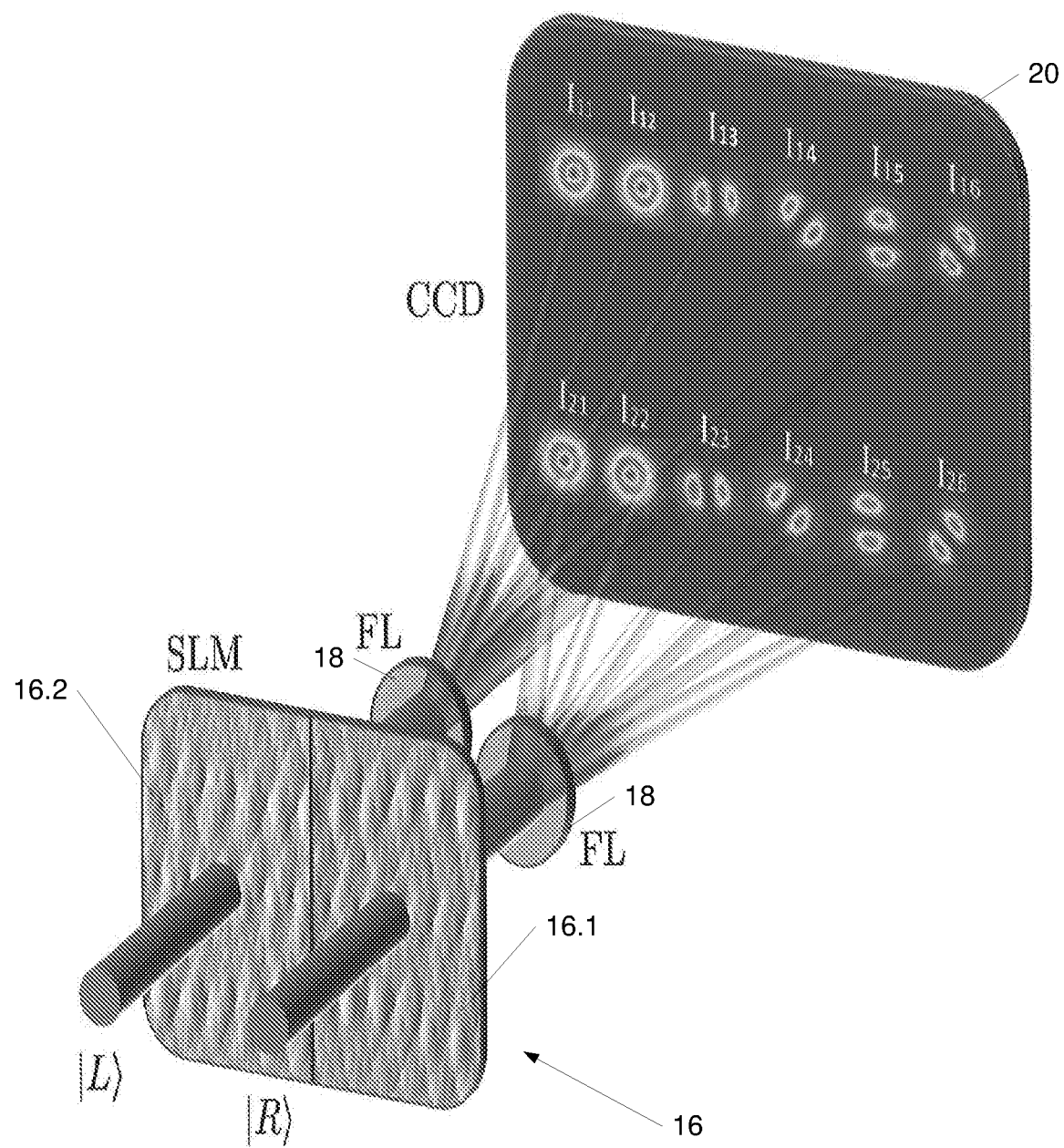
FIG. 6 shows an illustration of a single shot measurement of the VQF by the system of vector quality analyser of FIGS. 1 and 2 using demultiplexing holograms.

Referring to FIG. 6, as alluded to above, the intensity measurements necessary to compute the VQF can, equally, be obtained in real-time with a single measurement with the multiplexing all the required holograms into one single hologram displayed on the match filter arrangement 16 comprising an optical element such as SLM 16. Here, a superposition of the six previously used match filters, i.e., to detect the desired modes per polarisation component is encoded on two halves 16.1, 16.2 of a single SLM 16. In this way, a total of 12 outputs on the CCD camera 20 is obtained simultaneously in a single step or one shot, thereby facilitating real-time calculation of the VQF by way of the processor 22 in a manner described herein. The intensities of the modes detected by each of the 12 match filters, as well as the detector positions for the entries $l_{ij}$, are shown in FIG. 6 wherein it may be seen that the CCD 10 as being located in 12 specific predetermined zones in a manner as described above. Notwithstanding, it will be appreciated that nothing precludes the present invention from detecting the six modes per polarisation component in a sequential fashion.

Both the left- and right-circularly polarised arms are decomposed using the same set of holograms, such that the upper row of intensities corresponds to the left-circularly polarised arm and the bottom row to the right-circularly polarised arm.

It is pointed out that, while the implementation has been based on vector vortex beams, this is for convenience only. The concept and definition of a vector beam quality factor is independent of the type of vector beam, and only the optical elements in the measurement setup would require change (it is anticipated that many users will require a measure for a known form of vector beam). Moreover, this approach produces a single number that immediately indicates how vector the mode is, i.e., a quantitative measure. In contrast, the degree of polarisation produces a number for every point on the field, and thus while this is quantitative for a particular point, it does not determine the vector quality of the mode as a whole.

It will be appreciated that the vector mode sorter described above is not necessary to determine the vector quality factor, but serves as a secondary confirmation of the mode being analysed. Thus the real-time measurement of the twelve parameters with a single hologram makes the set-up comparatively as easy as performing a Stokes measurement. It is however envisioned that in some embodiments a vector beam analyser device may comprise both a vector quality analyser and a vector mode sorter, thereby to provide a user with an enlarged range of functionality.

Further, CCD detectors may be changed to other detector types in accordance with the wavelength and power levels to be detected The holograms may be chosen according to the modes under consideration, and need not be azimuthal modes used in the above example. For example, binary holograms for Hermite-Gaussian modes, or radial holograms for Bessel modes, may be used.

The present invention provides a new laser beam characterisation tool for arbitrary vector beams. The concept has been demonstrated on cylindrical vector vortex beams with is varying degree of vector quality, from purely scalar (OAM modes) to purely vector (radially polarised light as an example), and shown agreement between the predicted and measured vector quality factors. The vector quality factor offers a quantitative measure of the quality of a vector mode, which, it is believed, will be a useful tool in the analysis of such beams in both laboratory and industrial applications.

In the present disclosure, tools traditionally associated with quantum mechanics are used and are applied to vector beams. Because vector beams can be viewed as "entangled" in their spatial and polarisation degrees of freedom, entanglement measures are applied to quantify this quintessential property of vector modes, which is called the vector quality factor (VGF). This technique is demonstrated on a variety of beams in a continuous range from purely scalar to purely vector. This technique offers a new tool for laser beam characterisation of vector modes.

The invention claimed is:

1. A method for determining a beam quality factor (VQF) of a beam of light having a transverse electric field that may be scalar, vector, or a combination thereof, wherein the VQF is a measure of the degree of vectorness of the beam of light varying between pure scalar and pure vector, wherein the method comprises:
receiving a beam of light;
splitting the received beam of light into two orthogonal components;
detecting a predetermined number of modes or states per orthogonal component, wherein the predetermined number of modes or states detected are the same or substantially similar for each orthogonal component;
measuring an on axis intensity of each mode or state detected; and
calculating the VQF in terms of the measured on axis intensities using at least one quantum mechanical entanglement measure.

2. The method as claimed in claim 1, wherein the step of splitting the received beam of light into two orthogonal components comprises splitting the received beam of light into two orthogonal polarisation components, or two orthogonal spatial mode components.

3. The method as claimed in claim 1, wherein the predetermined number of modes or states detected per orthogonal component comprises a set of six modes or states, wherein the six modes or states include a pair of orthogonal modes or states, and four associated mutually un-biased modes or states.

4. The method as claimed in claim 3, wherein the four associated mutually unbiased modes or states are superpositions of the orthogonal basis modes or states with a relative phase delay between them.

5. The method as claimed in claim 3, wherein the step of detecting the predetermined number of modes or states per orthogonal component is by way of a match filter arrangement comprising match filters in the form of holograms encoded with suitable orthogonal and mutually associated unbiased functions for detecting the orthogonal and mutually unbiased modes or states.

6. The method as claimed in claim 5, wherein the match filter arrangement comprises an optical element having two zones which are each encoded or programmed with a superposition of holograms suitable for detecting the two orthogonal, and four associated mutually unbiased, modes or states, wherein the method comprises directing the two orthogonal components to the two zones, respectively, and detecting the two orthogonal, and four mutually unbiased, modes or states, per orthogonal component, in a simultaneous fashion, in real time.

7. The method as claimed in claim 3, wherein step of calculating the VQF comprises:
calculating three expectation values of Pauli's operators $\sigma_1$, $\sigma_2$, $\sigma_3$, wherein the first expectation value, $\sigma_1$, is calculated as the difference between the sum of the measured on axis intensities corresponding to first mutually un-biased modes or states associated with both orthogonal components and the sum of the measured on axis intensities corresponding to second mutually un-biased modes or states associated with both orthogonal components, wherein the second expectation value, $\sigma_2$, is calculated as the difference between the sum of the measured on axis intensities corresponding to third mutually un-biased modes or states associated with both orthogonal components and the sum of the measured on axis intensities corresponding to fourth mutually un-biased modes or states associated with both orthogonal components, and wherein the third expectation value, $\sigma_3$, is calculated as the difference between the sum of the measured on axis intensities corresponding to first orthogonal modes or states associated with both orthogonal components and the sum of the measured on axis intensities corresponding to second orthogonal modes or states associated with both orthogonal components;
calculating a length of the Bloch vector, s, using the calculated expectation values $\sigma_1$, $\sigma_2$, $\sigma_3$, as an input to following equation:

$$s = \left( \sum_{i=1}^{3} \langle \sigma_i \rangle^2 \right)^{\frac{1}{2}};$$

and calculating the VQF using the calculated value of the length of the Bloch vector, s, using the following equation:

$$VQF = \mathrm{Re}(C) = \mathrm{Re}\sqrt{(1-s^2)}$$

wherein the calculated VQF is 0 for pure scalar and 1 for pure vector, and intermediate for varying degrees of vector quality.

8. The method as claimed in claim 1, wherein the step of detecting the predetermined number of modes or states per orthogonal component is by way of modal decomposition.

9. The method as claimed in claim 1, wherein the method comprises measuring on axis on axis intensity of the detected modes or states in the Fourier plane, in a spatially resolved manner, via a suitable detector.

10. The method as claimed in claim 1, wherein at least one quantum mechanical entanglement measure is selected from a group comprising concurrence measured with a state tomography of a laser beam, alternatively entanglement entropy, and quantum discord.

11. A system for determining a beam quality factor (VQF) of a beam of light having a transverse electric field that may be scalar, vector, or a combination thereof, wherein the VQF is a measure of the degree of vectorness of the beam of light varying between pure scalar and pure vector, wherein the system comprises:
a beam splitter configured to split a received beam of light into two orthogonal components travelling in two optical paths;
a match filter arrangement intersecting the two optical paths, wherein the match filter arrangement is configured to detect a predetermined number of modes or states per orthogonal component, wherein the predetermined number of modes or states detected are the same or substantially similar for each orthogonal component;
a detector configured to measure an on axis intensity of each mode or state detected by the match filter arrangement; and
a processor configured to receive the on axis intensities measured by the detector, or data indicative thereof, and process the same to calculate the VQF in terms of the measured on axis intensities by using at least one quantum mechanical entanglement measure.

12. The system as claimed in claim 11, wherein the beam splitter is a polarisation splitter configured to split the received beam of light into two orthogonal polarisation components, or a spatial mode splitter configured to split the beam or light into two orthogonal spatial mode components.

13. The system as claimed in claim 12, wherein the polarisation splitter is selected from a group comprising a polarisation grating, polarisation beam splitter, geometric phase element/s, and birefringent prism/s.

14. The system as claimed in claim 11, wherein the predetermined number of modes or states detected per orthogonal component comprise a set of six modes or states, wherein the six modes or states include a pair of orthogonal modes or states, and four associated mutually un-biased modes or states.

15. The system as claimed in claim 14, wherein the match filter arrangement comprises match filters in the form of holograms encoded with suitable orthogonal and associated mutually unbiased functions for detecting the orthogonal and mutually unbiased modes or states.

16. The system as claimed in claim 15, wherein the match filter arrangement comprises an optical element having two zones, wherein each zone is encoded or programmed with a superposition of holograms suitable for detecting two orthogonal, and four associated mutually unbiased, modes or states in a simultaneous fashion, in real time, in use.

17. The system as claimed in claim 14, wherein the processor is configured to process the received on axis intensities measured by the detector, or data indicative thereof, thereby to calculate the VQF by:
calculating three expectation values of Pauli's operators $\sigma_1$, $\sigma_2$, $\sigma_3$, wherein the first expectation value, $\sigma_1$, is calculated as the difference between the sum of the measured on axis intensities corresponding to first mutually un-biased modes or states associated with both orthogonal components and the sum of the measured on axis intensities corresponding to second mutually un-biased modes or states associated with both orthogonal components, wherein the second expectation value, $\sigma_2$, is calculated as the difference between the sum of the measured on axis intensities corresponding to third mutually un-biased modes or states associated with both orthogonal components and the sum of the measured on axis intensities corresponding to fourth mutually un-biased modes or states associated with both orthogonal components, and wherein the third expectation value, $\sigma_3$, is calculated as the difference between the sum of the measured on axis intensities corresponding to first orthogonal modes or states associated with both orthogonal components and the sum of the measured on axis intensities corresponding to second orthogonal modes or states associated with both orthogonal components;
calculating a length of the Bloch vector, s, using the calculated expectation values $\sigma_1$, $\sigma_2$, $\sigma_3$, as an input to following equation:

$$s = \left( \sum_{i=1}^{3} \langle \sigma_i \rangle^2 \right)^{\frac{1}{2}};$$

and
calculating the VQF using the calculated value of the length of the Bloch vector, s, using the following equation:

$$VQF = \mathrm{Re}(C) = \mathrm{Re}\sqrt{(1-s^2)}$$

wherein the calculated VQF is 0 for pure scalar and 1 for pure vector, and intermediate for varying degrees of vector quality.

18. The system as claimed in claim 11, wherein the matched filter arrangement is configured to detect the predetermined number of modes or states per orthogonal component by way of modal decomposition.

19. The system as claimed in claim 11, wherein the system comprises a pair of Fourier lenses, each disposed in an optical path downstream from the match filter arrangement, wherein each Fourier lens projects the detected modes or states per orthogonal component onto the detector, in a spatially resolved manner, in the Fourier plane.

20. The system as claimed in claim 11, wherein at least one quantum mechanical entanglement measure is selected from a group comprising concurrence measured with a state tomography of a laser beam, alternatively entanglement entropy, and quantum discord.

* * * * *

UNITED STATES PATENT AND TRADEMARK OFFICE
CERTIFICATE OF CORRECTION

PATENT NO. : 10,648,856 B2
APPLICATION NO. : 16/310580
DATED : May 12, 2020
INVENTOR(S) : Andrew Forbes Page 1 of 1

It is certified that error appears in the above-identified patent and that said Letters Patent is hereby corrected as shown below:

In the Specification

Column 9, Line 37, Formula 3:

Please correct " $=\Sigma_{n=1}^{6} t_n$ ,,

To read -- $= \sum_{n=1}^{6} t_n$ --

In the Claims

Column 17, Line 13, Claim 9:
Please correct "measuring on axis on axis intensity"
To read -- measuring on axis intensity --

Signed and Sealed this
Sixth Day of October, 2020

Andrei Iancu
*Director of the United States Patent and Trademark Office*